US006494289B1

(12) United States Patent
Bachmann et al.

(10) Patent No.: US 6,494,289 B1

(45) Date of Patent: Dec. 17, 2002

(54) DEVICE FOR DYNAMIC EXCITATION OF PANEL LOUDSPEAKERS

(75) Inventors: Wolfgang Bachmann, Grevenbroich (DE); Gerhard Krump, Schwarzach (DE); Hans-Jürgen Regl, Duesseldorf (DE)

(73) Assignee: Harman Audio Electronic Systems GmbH (DE)

( * ) Notice: Subject to any disclaimer, the term of this patent is extended or adjusted under 35 U.S.C. 154(b) by 0 days.

(21) Appl. No.: 09/700,351

(22) PCT Filed: May 14, 1999

(86) PCT No.: PCT/EP99/03309

§ 371 (c)(1), (2), (4) Date: Jan. 26, 2001

(87) PCT Pub. No.: WO99/60817

PCT Pub. Date: Nov. 25, 1999

(30) Foreign Application Priority Data

May 15, 1998 (DE) ........................................ 198 21 861

(51) Int. Cl.[7] ................................................ H05K 5/00

(52) U.S. Cl. ........................ 181/173; 181/151; 381/423

(58) Field of Search ................................ 181/146, 150, 181/151, 141, 173, 171, 172, 166, 170; 381/152, 386, 398, 431, 423

(56) References Cited

U.S. PATENT DOCUMENTS 3,720,285 A * 3/1973 Russell et al. .............. 181/151

4,506,759 A * 3/1985 Fatovic ........................ 181/151

6,192,136 B1 * 2/2001 Azima ......................... 381/338

6,229,903 B1 * 5/2001 Kobayashi .................. 381/410

FOREIGN PATENT DOCUMENTS

WO 98/52383 * 11/1998

* cited by examiner

*Primary Examiner*—Khanh Dang

(74) *Attorney, Agent, or Firm*—Ware, Fressola, Van Der Sluys & Adolphson LLP

(57) ABSTRACT

The invention relates to the embodiment of panel loudspeakers 10 working according to the bending wave principle. Such loudspeakers 10 generally consist of an acoustic panel 11 and drivers 12, whereby the drivers 12 are connected to the acoustic panel 11. For the formation of bending waves in the acoustic panel 11, it is essentially important that the drivers 12 do not unnecessarily rigidize the acoustic panel 11. This has led to the arrangement of the drivers 12 at a distance from the acoustic panel 11 in a separate frame. In view of the complexity of such an arrangement, the invention aims at providing a connection between the drivers 12 and the acoustic panel 11 that can be supported directly on the acoustic panel 11 and which does not impede the propagation of the bending waves. This is achieved by connecting the drivers to the acoustic panel only at very few points 24 or by providing elastic member 25 in the fixing area of the drivers. A combination of both embodiments is also described.

12 Claims, 3 Drawing Sheets

DEVICE FOR DYNAMIC EXCITATION OF PANEL LOUDSPEAKERS

TECHNICAL FIELD

The invention concerns the construction of devices for the dynamic excitation of panel loudspeakers, particularly the connection of drivers to the acoustic panel in panel loudspeakers which operate according to the bending wave principle.

BACKGROUND OF THE INVENTION

Sound reproduction devices which operate according to the bending wave principle are known in the state of the art. Such devices, which are also called multiresonance panel loudspeakers, are essentially composed of an acoustic panel and at least one drive system in the form of a driver, where the acoustic panel is made to vibrate when electric sound signals are sent to the drivers. It is characteristic for such sound reproduction devices that a "bending wave radiation" becomes possible from a critical lower cut-off frequency, where the bending waves in the plane of the respective panel lead to a sound radiation with a frequency-dependent direction. In other words, a cut through an established directivity diagram shows a principal lobe whose direction is frequency-dependent. These relationships apply to endlessly expanded panels, while the relationships of the multiresonance panels treated in this application are clearly more complex because of the strong edge reflexes. This complexity of multiresonance panels comes from the fact that the cited principal lobe is superimposed by a number of other such principal lobes in a frequency-dependent direction, so that a widely fanned out directivity diagram is created which is also very frequency-dependent. But the multiresonance panels treated here have in common that their directivity diagrams on the average point away from the mid-perpendicular. This behavior causes the room to be more involved in the sound wave projection.

The acoustic panel is constructed according to the sandwich principle, where each of two superimposed surfaces of a very light core layer are connected to a thin cover layer, for example by bonding. For the acoustic panel to have good sound reproduction characteristics, the material of the cover layer must have an especially high dilatational wave speed. Suitable materials are for example thin metal foils or also fiber-reinforced plastic foils.

Special demands are also made on the core layer. It is therefore necessary for the applicable materials to have low mass density and low damping. The core layer materials must furthermore have as high a shear modulus as possible, vertically to the surfaces which are connected to the cover layers. Finally it is necessary for the materials to be used as core layers to have a very low modulus of elasticity in the direction in which the core layer made of these materials has its greatest expansion later on. These two premises, which at first sight seem to be contradictory with respect to the last two requirements, are best fulfilled by a core layer with a perforated structure of openings that preferably have a small cross section, located between the two surfaces provided with the cover layers. In addition to the core layer with the perforated structure, rigid foams can also be used as core layer materials, because they still have suitable shear and elasticity moduli in spite of their isotropic material characteristics. In this connection it must also be mentioned that when rigid foams are used as the core layer material, the cover layers must provide the required anisotropic behavior of the acoustic panel.

In order to radiate sound waves by means of an above described acoustic panel, it is necessary to connect the acoustic panel to at least one driver, which then produces vibrations in the acoustic panel vertically to the plane of the cover layers by means of time-variable power effects. To that end the state of the art generally uses electrodynamic drive systems such as are also used in principle to drive conventional loudspeakers. The drivers are usually equipped with corresponding braces so that these drive systems produce the necessary deformation of the acoustic panel to create bending waves. These braces can be formed for example by a support structure which is arranged at a distance from one of the two cover foils and contains the drive systems. Aside from the fact that such a support structure not only increases the structural depth and the weight of such devices, these support structures also require a considerable production effort. It can therefore be envisioned to directly connect the support structures, which are used as braces for the drive systems, to the acoustic panel. However it is a disadvantage that the support structures connected to the acoustic panel make the generation of bending waves more difficult due to unfavorable changes in the spot impedances.

SUMMARY OF THE INVENTION

The object of the invention is therefore to present a panel loudspeaker or better yet a holder for drivers of multiresonant panel loudspeakers, which are connected to the acoustic panel but do not, or only insignificantly, impede its deformation despite the connection to the acoustic panel.

This object is achieved by a device for the dynamic excitation of panel loudspeakers with an acoustic panel which comprises a core layer and at least one cover layer, with at least one electromagnetic driver which has a magnet system, and a holder which connects the driver to the acoustic panel, wherein a ring made of an elastic material is provided as the holder of the respective driver, which concentrically surrounds the magnetic system and is connected thereto, and the ring is arranged in a tube and is connected thereto, while the tube in turn is connected to the acoustic panel.

If the holder of the respective driver is connected in at least three places to the acoustic panel, on the one hand the driver is attached to the acoustic panel, and on the other the free mobility of the acoustic panel is considerably improved, in contrast to the otherwise usual or imaginable connections. Four or more places whereby the driver is connected to the acoustic panel lead to more extensive damping even though better mobility is still provided, compared to conventional connections.

The same result is obtained when the driver is connected to the acoustic panel with a holder containing an elastic member, since this type of connection also ensures that the bending waves which are impressed by the driver on the acoustic panel are able to propagate freely therein.

It is particularly advantageous when the holder, which is only connected at three points to the acoustic panel, is additionally equipped with elastic members, because these strengthen the decoupled connection between the driver and the acoustic panel, since low frequency tuning is required in all cases, i.e. the lowermost natural resonance of the system's driver plus holder must clearly be lower than the lowest (reproduced) frequencies of interest.

BEST MODE FOR CARRYING OUT THE INVENTION

The invention will now be explained in greater detail by means of the figures.

Figure 1:
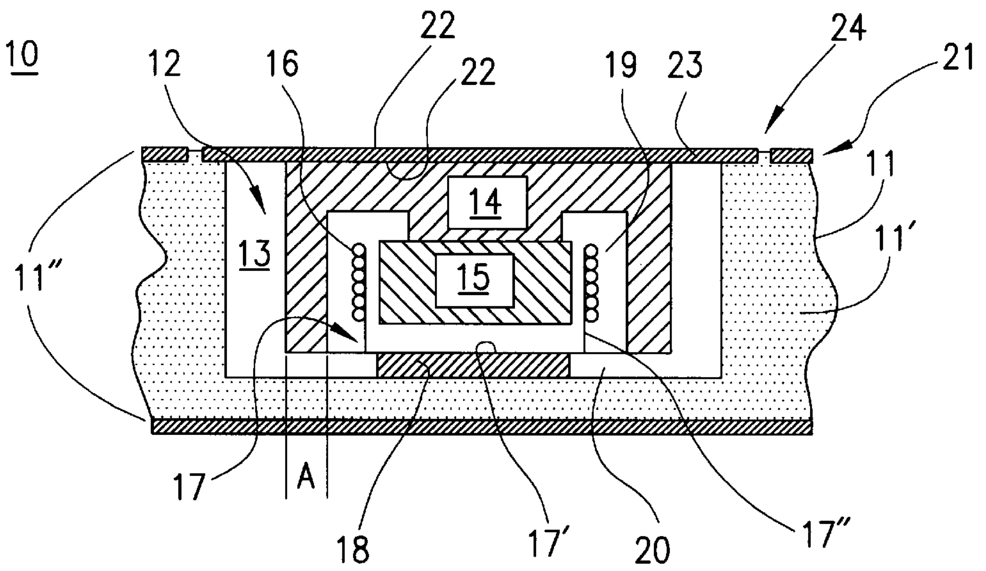
FIG. 1 is a cut through a panel loudspeakers.
Figure 2:
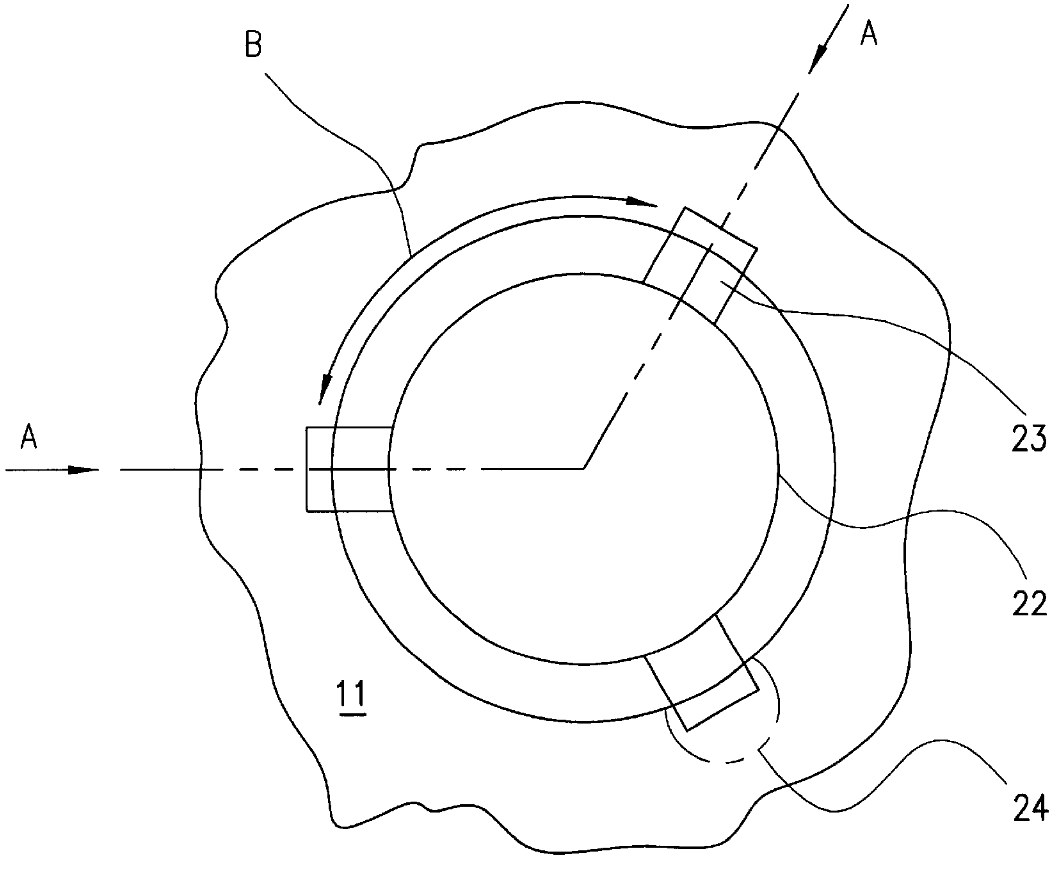
FIG. 2 is a top view of a panel loudspeaker according to claim 1.

FIG. 1 shows a cut along AA in FIG. 2 through a panel loudspeaker 10. This panel loudspeaker 10 is essentially composed of an acoustic panel 11 and an electromagnetic driver 12. The acoustic panel 11 is composed of a rigid foam core layer 11', which is connected to two cover layers 11". In another not illustrated embodiment, the core layer 11 can also have a honeycomb structure. A cut-out 13 is milled into the acoustic panel 11 to receive the driver 12. The driver 12 is essentially formed by a cup-shaped backup element 14, a permanent magnet 15 and a voice coil support 17 with a voice coil 16. The voice coil support 17 is also cup-shaped and its bottom 17' is connected to the core layer 11' by a panel 18. The rim 17" of the voice coil support 17, which is equipped with the voice coil 16, dips into an air gap 19 left in a driver 12. In addition the voice coil support 17 is connected to the backup element 14 with a centering membrane (spider) 20. Further details of this centering membrane 20 can be found in a parallel application which was submitted simultaneously with this application.

The side 21 is provided with a holder 22 to connect the driver 12, or rather the heavy unit composed of the backup element 14 and the permanent magnet 15, to the panel loudspeaker 10. This holder 22 is equipped with three clips 23 (FIG. 2) which span the lateral distance A between the backup element 14 and the core layer 11'.

The effect of this attachment in only three places 24 between the driver 12 and the acoustic panel 11, on the bending waves which are impressed by the voice coil support 17 into the acoustic panel 11 during the operation of the panel loudspeaker 10, is that they are mostly transmitted without being affected by the holder 22. This is attributed to the fact that the areas B between the individual clips 23 are not stiffened by them (indicated only by a double arrow in FIG. 2 for one area between two clips).

In the embodiment shown in FIGS. 1 and 2, the holder 22 and all the clips 23 are made of plastic. Insofar as good heat conduction is desired from the driver 12, the holder 22 can also be made of metal or it can be limited to the clips 23 alone.

Figure 3:
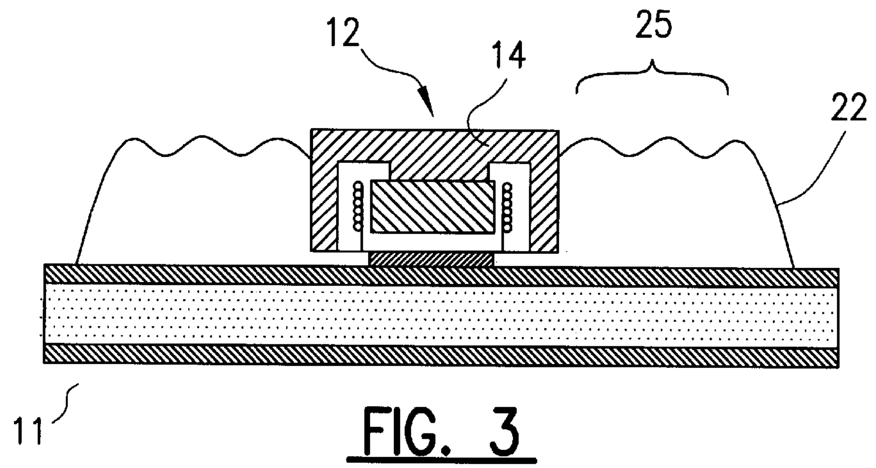
FIG. 3 is another configuration of the illustration in FIG. 1.

FIG. 3 shows a configuration where the driver 12 is not integrated into the acoustic panel 11, but is rather installed on the outside of the acoustic panel 11. A holder 22 which has an elastic element 25 in the form of a corrugated contour, is provided to support the weight of the driver 12. The holder 22 in FIG. 3 is furthermore built circumferential and is connected throughout to the acoustic panel 11. The stiffening of the acoustic panel 11 which results from this continuous connection is reduced in that the elastic member 25 in the form of the corrugated contour is able to yield to the impressed bending waves.

Figure 4:
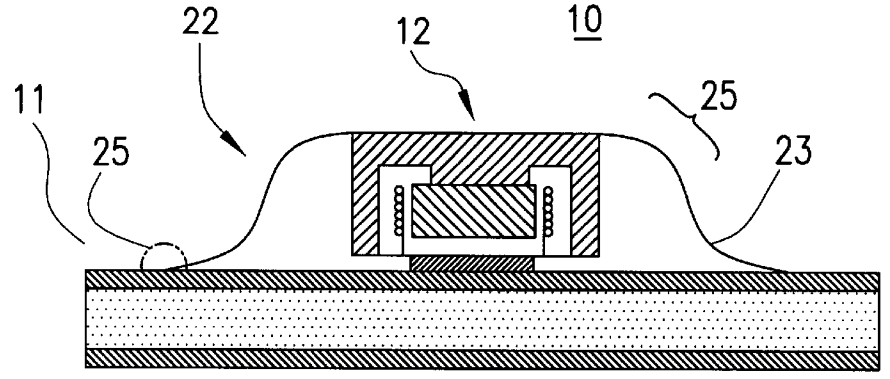
FIG. 4 is another configuration of the illustration in FIG. 1.
Figure 5:
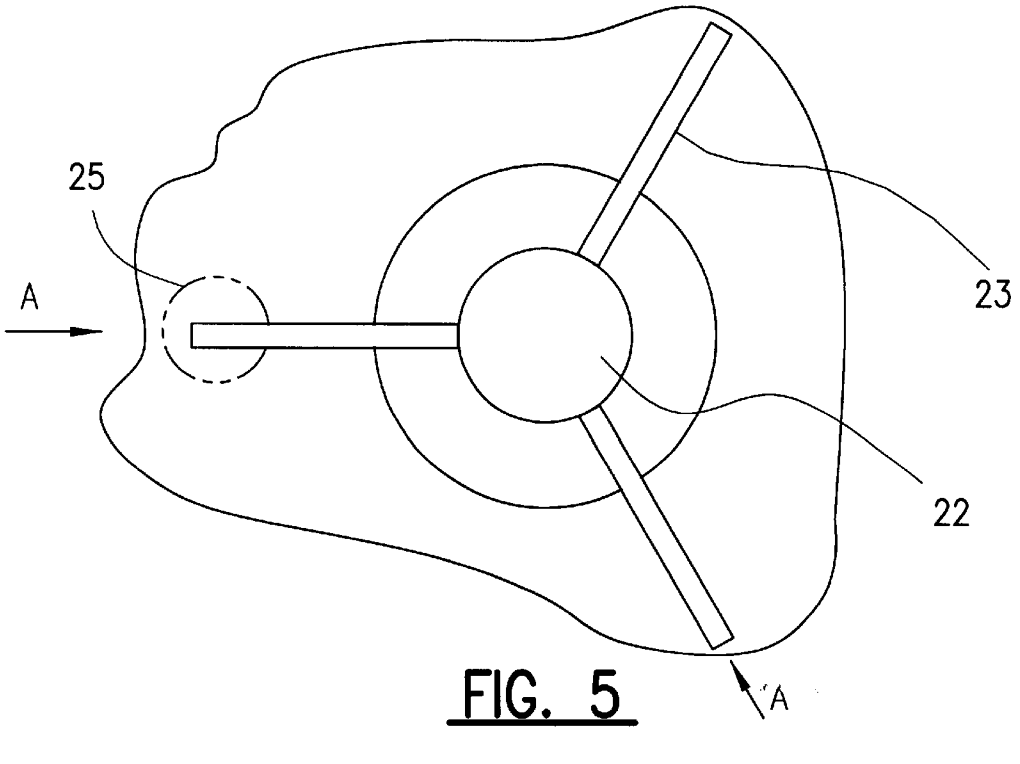
FIG. 5 is a top view of a panel loudspeaker in FIG. 4.

In the embodiment of FIG. 4 the driver 12 is also installed on the outside of the acoustic panel 11 and is connected thereto by a holder 22. Similar to the embodiment in FIG. 1, the holder 22 in FIG. 4 also comprises only three clips 23, which lead from the driver 12 to the acoustic panel 11 and are connected thereto in the places 24 (FIG. 5). Because the clips 23 have a curved contour (FIG. 4), they simultaneously act as elastic elements 25 and support the free mobility of the acoustic panel 11 during operation.

It should also be mentioned in this connection that the flat clips 23 used in the embodiment in FIGS. 1 and 2 can also be provided with an elastic member 25. This elastic member 25 can be produced for example by designing very thin clips 23 and/or increasing the distance A between the core layer 11' and the backup element 14.

Figure 6:
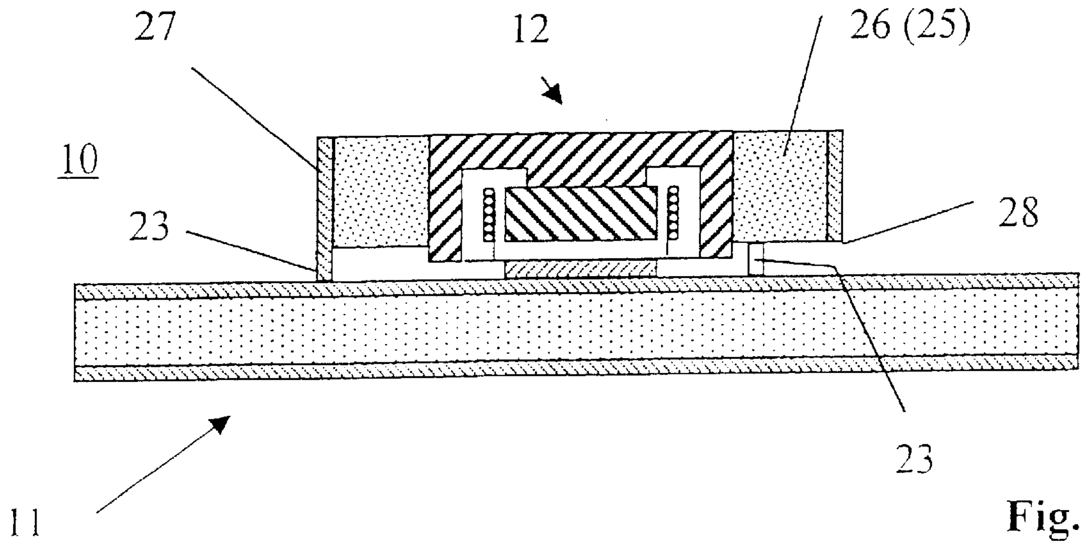
FIG. 6 is another configuration of the illustration in FIG. 1.

FIG. 6 shows a cut along the center line through a panel loudspeaker 10 with a laterally installed driver 12. The holder 22 between the driver 12 and the acoustic panel 11 is loosened so that the backup element 14 is connected to a ring 26 made of an elastic material. In this case the ring 26, which acts as an elastic member 25, is made of a foam material and is inserted into a tube 27. The side 28 facing the acoustic panel 11 is equipped with three clips 23 (only two of which can be seen in FIG. 6), and provide the connection to the acoustic panel 11. In this configuration as well, the decoupled connection between the driver 12 and the acoustic panel 11 is accomplished by a combination of an elastic member 25 and an attachment that is limited to three (connecting) places 24. Finally it should be pointed out that other modifications of the shown holder 22 are possible. For example it is possible to change the holder 22 in FIGS. 4 and 6 so that it secures a driver 12 which is integrated into the acoustic panel 11 as shown in FIG. 1.

What is claimed is:

1. A device for the dynamic excitation of panel loudspeakers with an acoustic panel (11) which comprises a core layer (11') and at least one cover layer (11"), with at least one electromagnetic driver (12) which has a magnet system, and a holder (22) which connects the driver (12) to the acoustic panel (11), characterized in that a ring (26) made of an elastic material is provided as the holder (22) of the respective driver (12), which concentrically surrounds the magnetic system and is connected thereto, and the ring (26) is arranged in a tube (27) and is connected thereto, while the tube (27) in turn is connected to the acoustic panel (11).

2. A device as claimed in claim 1, characterized in that the ring (26) has a rectangular cross section.

3. A device as claimed in claim 2, characterized in that the connection of tube (27) and acoustic panel (11) is at least provided in three points.

4. A device as claimed in claim 3, characterized in that at least three clips (23) are provided to connect the tube (27) and the acoustic panel (11).

5. A device as claimed in claim 4, characterized in that the driver (12) is at least partially integrated into the acoustic panel (11).

6. A device as claimed in claim 4, characterized in that the driver (12) is installed on the acoustic panel (11).

7. A device as claimed in claim 6, characterized in that foam material is provided as an elastic material.

8. A device as claimed in claim 7, characterized in that the whole inside of the ring (26) is connected to the magnetic system and its whole outside is connected to the tube (27).

9. A device as claimed in claim 1, characterized in that the driver (12) is at least partially integrated into the acoustic panel (11).

10. A device as claimed in claim 1, characterized in that the driver (12) is installed on the acoustic panel (11).

11. A device as claimed in claim 1, characterized in that foam material is provided as an elastic material.

12. A device as claimed in claim 1, characterized in that the whole inside of the ring (26) is connected to the magnetic system and its whole outside is connected to the tube (27).

* * * * *